US012738446B2

(12) United States Patent
Geurink et al.

(10) Patent No.: US 12,738,446 B2
(45) Date of Patent: Sep. 15, 2026

(54) LASER THERMAL EPITAXY IN A CHARGED PARTICLE MICROSCOPE

(71) Applicant: FEI Company, Hillsboro, OR (US)

(72) Inventors: Rudolf Geurink, Sint-Michielsgestel (NL); Hugo Cornelis Van Leeuwen, Eindhoven (NL); Gerard Nicolass Anne Van Veen, Riethoven (NL); Pleun Dona, Veldhoven (NL); Stephan Kujawa, Veldhoven (NL); Maarten Bischoff, Uden (NL)

(73) Assignee: FEI Company, Hillsboro, OR (US)

( * ) Notice: Subject to any disclaimer, the term of this patent is extended or adjusted under 35 U.S.C. 154(b) by 680 days.

(21) Appl. No.: 18/054,880

(22) Filed: Nov. 11, 2022

(65) Prior Publication Data

US 2024/0161999 A1 May 16, 2024

(51) Int. Cl.

| | |
|---|---|
| ***H01J 37/18*** | (2006.01) |
| ***H01J 37/20*** | (2006.01) |
| ***H01J 37/22*** | (2006.01) |
| ***H01J 37/244*** | (2006.01) |
| ***H01J 37/26*** | (2006.01) |
| ***H01J 37/28*** | (2006.01) |

(52) U.S. Cl.

CPC .............. *H01J 37/18* (2013.01); *H01J 37/20* (2013.01); *H01J 37/226* (2013.01); *H01J 37/244* (2013.01); *H01J 37/265* (2013.01); *H01J 37/28* (2013.01); *H01J 2237/2802* (2013.01)

(58) Field of Classification Search

CPC .......... H01J 37/18; H01J 37/20; H01J 37/226; H01J 37/244; H01J 37/265; H01J 37/28; H01J 2237/2802

See application file for complete search history.

(56) References Cited

U.S. PATENT DOCUMENTS

| | | | | |
|---|---|---|---|---|
| 7,989,778 | B2 * | 8/2011 | Oetelaar | H01J 37/26 977/854 |
| 8,314,410 | B2 | 11/2012 | Straw et al. | |
| 10,475,629 | B2 | 11/2019 | Mitchels et al. | |
| 2008/0250881 | A1 * | 10/2008 | Dona | H01J 37/20 73/864.91 |
| 2013/0214468 | A1 * | 8/2013 | Giannuzzi | G01N 1/00 156/60 |
| 2018/0353960 | A1 * | 12/2018 | Dimov | B01L 3/502761 |
| 2020/0264115 | A1 * | 8/2020 | Phaneuf | G01N 23/20025 |

FOREIGN PATENT DOCUMENTS

| | | | |
|---|---|---|---|
| EP | 2644308 | A1 | 3/2013 |
| EP | 3723933 | A1 | 10/2020 |

OTHER PUBLICATIONS

Braun et al. "Film Deposition by Thermal Lase Evaporation" AIP Advances 9 Materials Science Collection, May 29, 2019, 6 pages.

* cited by examiner

*Primary Examiner* — Georgia Y Epps
*Assistant Examiner* — Hanway Chang
(74) *Attorney, Agent, or Firm* — Leron Vandsburger

(57) ABSTRACT

The present disclosure relates to a charged particle microscope in which in-situ thermal laser epitaxy can be performed and the product analysed, methods of performing in-situ thermal laser epitaxy and analysis within the charged particle microscope and the combination of at least one cartridge and a laser for use in a charged-particle microscope to provide in-situ thermal laser epitaxy and analysis are also described.

20 Claims, 5 Drawing Sheets

100

LASER THERMAL EPITAXY IN A CHARGED PARTICLE MICROSCOPE

TECHNICAL FIELD

Embodiments of the present disclosure relate to the field of charged particle microscopy. In particular, systems, methods, and combinations for in-situ sample preparation are described.

BACKGROUND

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g. a FIB-SEM), which additionally employ a "machining" Focused Ion Beam (FIB), allowing supportive activities such as ion-beam milling or Ion-Beam-Induced Deposition (IBID), for example. The skilled person will be familiar with the different species of charged particle microscopy.

Semiconductor designers rely on analytical tools that offer flexibility and stability, as well as high-resolution imaging, to analyse device performance. Charged particle microscopes are one of the main tools used due to their ability to evaluate interfacial details, dimensions of device structures, and defects or flaws that arise during the fabrication process.

Chemical vapor deposition (CVD) is a deposition method used to produce high quality, and high-performance, solid materials. The process is often used in the semiconductor industry to produce thin films. Several other techniques are known, such as molecular beam epitaxy (MBE), pulsed layer deposition (PLD) and sputtering. These methods typically excite source material either indirectly by placing it into a heated crucible or directly by an electron/laser beam.

SUMMARY

Embodiments of the present disclosure provide one or more of: a charged particle microscope in which in-situ thermal laser epitaxy can be performed and the product analysed, methods of performing in-situ thermal laser epitaxy and analysis within the charged particle microscope, and a combination of at least one cartridge and a laser, configured for in-situ thermal laser epitaxy and analysis in a charged-particle microscope to provide.

A charged particle microscope (CMP) can include: a vacuum chamber; a particle-optical column configured to produce a charged particle beam and direct the charged particle beam so as to irradiate a sample in the vacuum chamber; a cartridge holder configured to releasably retain at least one cartridge; an illuminator configured to direct the charged particle beam emitted from the particle column onto the sample; a detector oriented toward a sample position and configured to detect a flux of radiation emanating from the sample in response to irradiation by the charged particle beam; and a laser; wherein the charged-particle microscope can further include a control unit configured to control operations of the charged particle microscope; wherein the sample and at least one vaporisation material/target can be disposed in at least one cartridge and the at least one cartridge can be configured to allow movement of the sample and the at least one vaporisation material/target in and out of the vacuum chamber; and the laser can be configured to heat the at least one vaporisation material/target in-situ to produce an evaporated plume of material/target onto the sample.

The charged particle microscope can also include a means, such as a loader, for controllably guiding the at least one cartridge into and out of the vacuum chamber of the charged-particle microscope.

In this way, the at least one cartridge can be moved in and out of the vacuum chamber of the charged-particle microscope without substantially impacting on the conditions within the vacuum chamber, for example, without a substantial loss of pressure.

The system can also include an interface or stage within the vacuum chamber of the charged-particle microscope for removably accommodating and positioning, in operational use of the system, the at least one cartridge.

The stage can hold the at least one cartridge in a deposition position for heating the at least one vaporisation material/target with the laser and an irradiation position for irradiation of the sample with the charged particle beam. In an aspect, the deposition position and the irradiation position can be the same. The stage can be configured to maintain the geometry of the cartridge such that the irradiation position and the deposition position coincide.

The stage can be used to transfer the sample between the irradiation position and the deposition position.

The cartridge can include a mirror configured to deflect energy from the laser onto the at least one sample or a specific region of the sample.

The laser can have from 1 to 3 degrees of freedom.

The laser can be configured to heat multiple vaporisation material/targets concurrently or sequentially.

The charged-particle microscope can be a transmission electron microscope (TEM).

The vacuum chamber can be configured to maintain a pressure of $10^{-3}$ mbar or lower.

Embodiments of the present disclosure include a method of performing in-situ thermal laser epitaxy and sample analysis in a charged-particle microscope as defined above, wherein the method includes providing a sample and at least one vaporisation material/target in at least one cartridge; loading the at least one cartridge into the vacuum chamber of the charged particle microscope; heating the at least one target with the laser to provide a vapour plume of target material on the sample.

The method can include irradiating the sample with a charged particle beam.

The at least one cartridge can be held in a loader chamber under vacuum before being loaded into the vacuum chamber of the charged particle microscope as defined previously.

The at least one cartridge can be held in a cartridge holder within the vacuum chamber of the charged-particle microscope. Once loaded into the vacuum chamber of the charged particle microscope, the at least one cartridge and/or cartridge holder can be placed on stage within the vacuum chamber of the charged-particle microscope. The stage can move the at least one cartridge and/or cartridge holder between the deposition position and the irradiation position or maintain the geometry of the at least one cartridge and/or cartridge holder such that the irradiation position and the deposition coincide.

Embodiments of the present disclosure include a combination of at least one cartridge and a laser for use in a charged-particle microscope. The microscope can include: a vacuum chamber; a particle-optical column for producing a charged particle beam and directing it so as to irradiate a sample; a cartridge holder for holding at least one cartridge in the vacuum chamber; an illuminator for directing the charged particle beam emitted from the particle column onto the sample; a detector for detecting a flux of radiation emanating from the sample in response to irradiation by said beam; and a control unit for controlling operations of the charged particle microscope, characterised in that the charged-particle microscope is configured to: receive a sample and at least one vaporisation material/target in at least one cartridge, wherein the at least one cartridge is configured to allow movement of the sample and at least one vaporisation material/target in and out of the vacuum chamber; and heat the at least one vaporisation material/target in-situ with the laser to produce an evaporated plume of material/target onto the sample.

It would be clear to the person skilled in the art that the features and combinations defined with respect to the charged particle microscope, apply equally to the method and combination defined above.

BRIEF DESCRIPTION OF THE DRAWINGS

The present disclosure will now be elucidated in more detail on the basis of exemplary embodiments and the accompanying schematic drawings, in which.

In the Figures, where pertinent, corresponding parts can be indicated using corresponding reference symbols. The figures illustrate, by way of example, not by way of limitation, the principles of the present disclosure. The figures in combination with the description will clearly enable one skilled in the art to make and use embodiments of the present disclosure, and described several embodiments, adaptions, variations, alternatives and uses of the present disclosure.

DETAILED DESCRIPTION OF THE DRAWINGS

Embodiments of the present disclosure relate to a charged particle microscope in which in-situ thermal laser epitaxy can be performed and the product analysed, methods of performing in-situ thermal laser epitaxy and analysis within the charged particle microscope and the combination of at least one cartridge and a laser for use in a charged-particle microscope to provide in-situ thermal laser epitaxy and analysis are also described.

Chemical vapor deposition (CVD) is a vacuum deposition method used to produce high quality, and high-performance, solid materials. The process is often used in the semiconductor industry to produce thin films. Several other techniques are known, such as molecular beam epitaxy (MBE), pulsed layer deposition (PLD) and sputtering. These methods typically excite source material either indirectly by placing it into a heated crucible or directly by an electron/laser beam. When using such techniques, it is important to eliminate oxygen from the processing point to avoid oxidation. This is because typically, researchers, chemists etc will want to study the sample in its original/pristine state and avoid chemical reactions that can result in the formation of unwanted by-products. CVD is therefore typically conducted in a vacuum, such as an ultra-high vacuum, and at elevated temperature in a furnace.

Thermal laser heating, also known as thermal laser epitaxy (TLE), offers several advantages for vacuum evaporation. First, laser beams do not contaminate their target. A laser features an almost arbitrary power density and therefore allows very high evaporation temperatures. Second, all energy sources are located outside the vacuum, thus eliminating electrical feedthroughs and allowing a compact, minimalistic mechanical design. Finally, the laser beam is not affected by the atmosphere in the vacuum chamber, therefore any gas suitable for the growth process can be used.

It would therefore be advantageous to provide a system whereby the products of TLE could be produced and analysed in-situ. It would be further advantageous to enable the production and analysis to be performed in-situ in a charged particle microscope without affecting the vacuum within the microscope and therefore reducing the risk of sample contamination.

Figure 1:
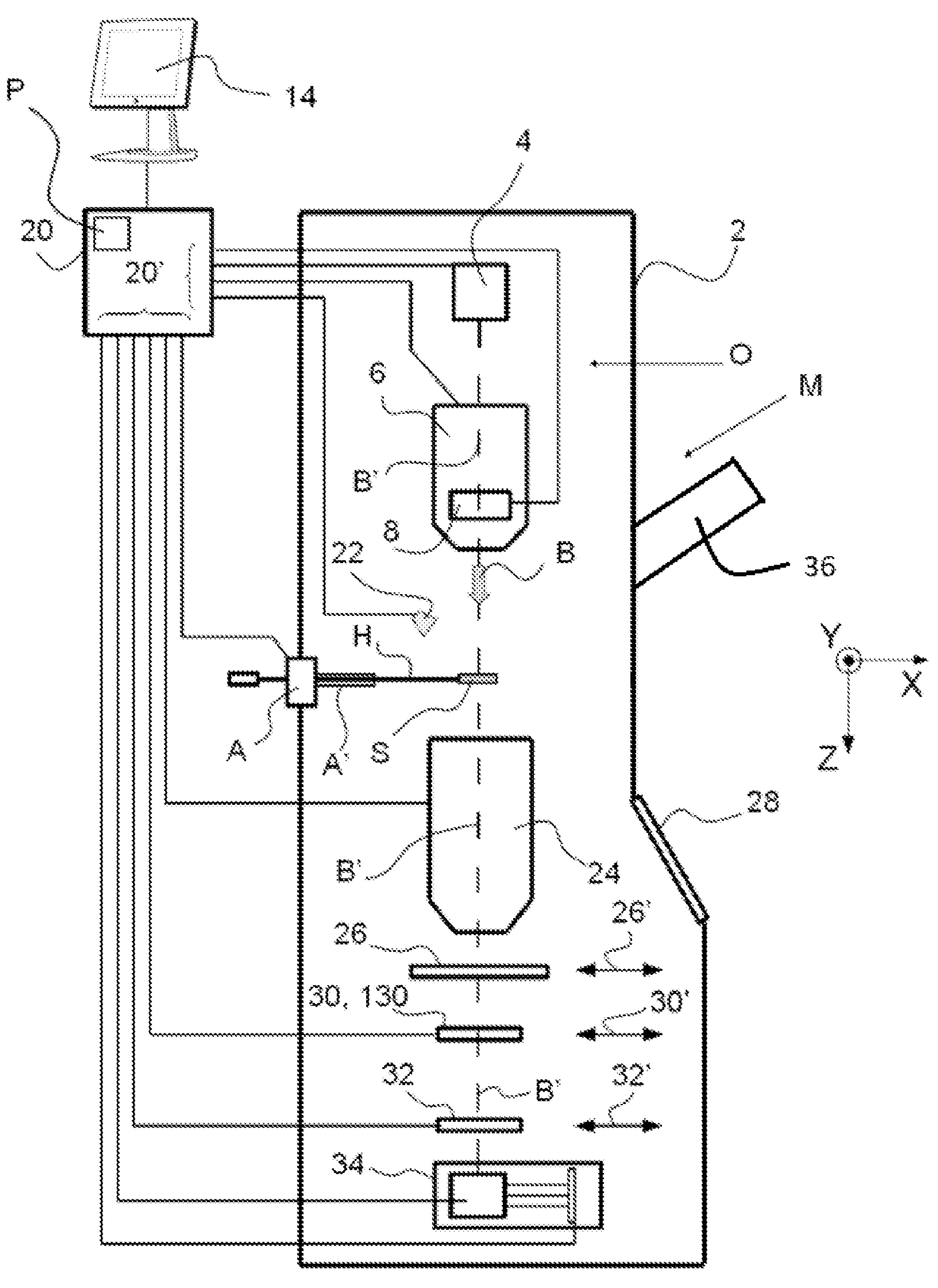
FIG. 1 shows a longitudinal cross-sectional view of a TEM/STEM that can be used in embodiments of the present disclosure.

FIG. 1 (not to scale) is a highly schematic depiction of a charged-particle microscope M. More specifically, it shows a transmission-type microscope M, which, in this case, is a TEM/STEM (though, in the context of the present disclosure, it could just as validly be a SEM (see FIG. 2), or an ion-based microscope, for example).

In FIG. 1, within a vacuum chamber (enclosure) 2, a charged particle beam source 4 produces a beam B of electrons that propagates along an electron-optical axis B' and traverses an electron-optical illuminator 6, serving to direct/focus the electrons onto a chosen part of a sample S (which can, for example, be (locally) thinned/planarized). Also depicted is a deflector 8, which (inter alia) can be used to effect scanning motion of the beam B.

The sample S is held on a cartridge on a cartridge holder H that can be positioned in multiple degrees of freedom by a positioning device/stage A, which moves a cradle A' into which holder H is (removably) affixed; for example, the cartridge holder H can comprise a finger that can be moved (inter alia) in the XY plane (see the depicted Cartesian coordinate system; typically, motion parallel to Z and tilt about X/Y will also be possible). Such movement allows different parts of the sample S to be irradiated/imaged/inspected by the electron beam B traveling along axis B' (in the Z direction) (and/or allows scanning motion to be performed, as an alternative to beam scanning) If desired, an optional cooling device (not depicted) can be brought into intimate thermal contact with the cartridge holder H, so as to maintain it (and the sample S thereupon) at cryogenic temperatures, for example.

The electron beam B will interact with the sample S in such a manner as to cause various types of "stimulated" radiation to emanate from the sample S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX or EDS (Energy-Dispersive X-Ray Spectroscopy) module, for instance; in such a case, an image could be constructed using basically the same principle as in a SEM. However, alternatively or supplementally, one can study electrons that traverse (pass through) the sample S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the sample S will be formed by imaging system 24 on screen 26, and this can be viewed through viewing port 28 located in a suitable part of a wall of enclosure 2. The retraction mechanism for screen 26 can, for example, be mechanical and/or electrical in nature, and is not depicted here.

As an alternative to viewing an image on screen 26, one can instead make use of the fact that the depth of focus of the electron flux leaving imaging system 24 is generally quite large (e.g. of the order of 1 meter). Consequently, various other types of analysis apparatus can be used downstream of screen 26, such as:

- TEM camera 30. At camera 30, the electron flux can form a static image (or diffractogram) that can be processed by controller/processor 20 and displayed on a display device 14, such as a flat panel display, for example. Camera 30 can be retracted/withdrawn (as schematically indicated by arrows 30') so as to get it out of the way of axis B'.
- STEM camera 32. An output from camera 32 can be recorded as a function of (X,Y) scanning position of the beam B on the sample S, and an image can be constructed that is a "map" of output from camera 32 as a function of X,Y. Camera 32 can comprise a single pixel with a diameter of e.g. 20 mm, as opposed to the matrix of pixels characteristically present in camera 30, although camera 32 can be a pixelated detector, such as an Electron Microscope Pixel Array Detector (EMPAD) as well. Moreover, camera 32 will generally have a much higher acquisition rate (e.g. $10^6$ points per second) than camera 30 (e.g. $10^2$ images per second).

Camera 32 can be retracted/withdrawn (as schematically indicated by arrows 32') so as to get it out of the way of axis B'. Such retraction can be avoided in the case of a donut-shaped annular dark field camera 32, for example; in such a camera, a central hole would allow flux passage when the camera was not in use. As an alternative to imaging using cameras 30 or 32, one can also invoke spectroscopic apparatus 34, which could be an EELS module, for example.

In the system show, the laser 36 is position on the outside of the charged particle microscope.

It should be noted that the order/location of items 30, 32, 34 and 36 is not strict, and many possible variations are conceivable. For example, spectroscopic apparatus 34 can also be integrated into the imaging system 24.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). The (schematically depicted) controller 20 can be (partially) inside or outside the enclosure 2, and can have a unitary or composite structure, as desired. The controller comprises, as shown in this embodiment, a data processing apparatus P that is arranged for carrying out the method as defined herein.

The skilled artisan will understand that the interior of the enclosure 2 does not have to be kept at a strict vacuum. In such situations an additional enclosure can be present around the sample to provide a separate or additional vacuum chamber around the sample; for example, in a so-called "Environmental TEM/STEM", a background atmosphere of a given gas is deliberately introduced/maintained within the additional enclosure (not shown). The skilled artisan will also understand that, in practice, it can be advantageous to confine the volume of enclosure 2 so that, where possible, it essentially hugs the axis B', taking the form of a small tube (e.g. of the order of 1 cm in diameter) through which the employed electron beam passes, but widening out to accommodate structures such as the source 4, sample holder H, screen 26, camera 30, camera 32, spectroscopic apparatus 34, etc.

Figure 2:
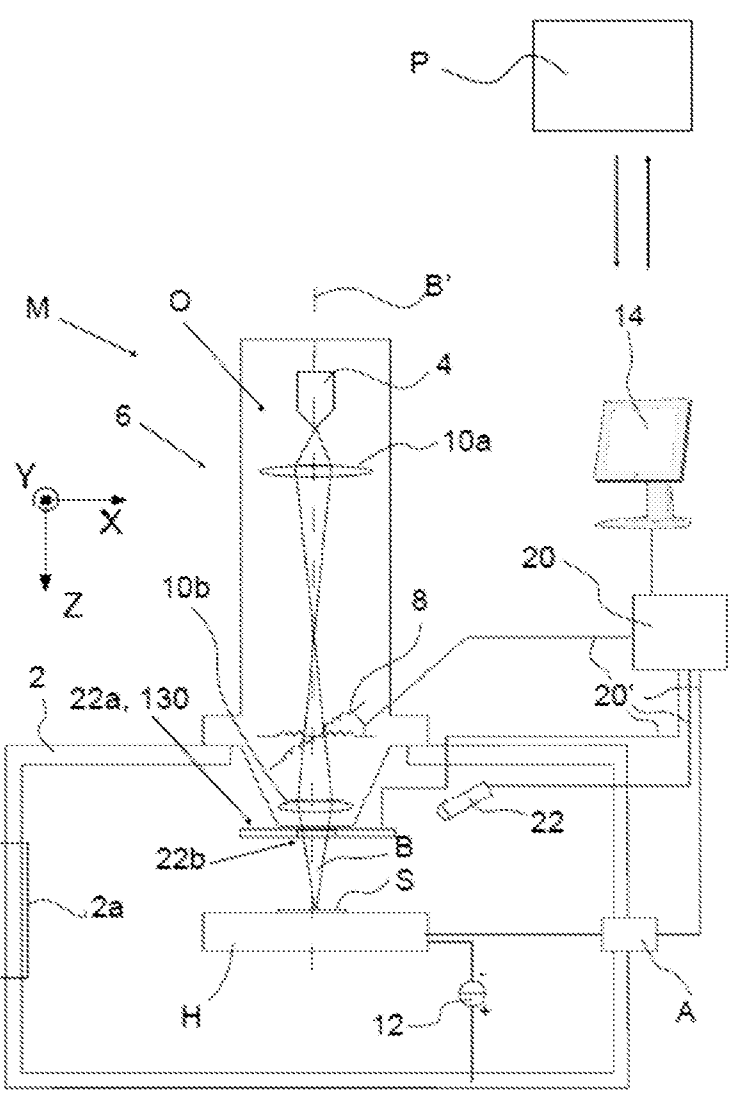
FIG. 2 shows a longitudinal cross-sectional view of a SEM that can be used in embodiments of the present disclosure.

Now referring to FIG. 2, another embodiment of a charged particle apparatus is shown. FIG. 2 (not to scale) is a highly schematic depiction of a charged-particle microscope M; more specifically, it shows an embodiment of a non-transmission-type microscope M, which, in this case, is a SEM (though, in the context of the present disclosure, it could just as validly be an ion-based microscope, for example). In the Figure, parts which correspond to items in FIG. 1 are indicated using identical reference symbols and will not be separately discussed here. Additional to FIG. 1 are (inter alia) the following parts:

- 2*a*: A vacuum port, which can be opened so as to introduce/remove items (components, samples) to/from the interior of vacuum chamber 2, or onto which, for example, an ancillary device/module can be mounted. The microscope M can comprise a plurality of such ports 2*a*, if desired;
- 10*a*, 10*b*: Schematically depicted lenses/optical elements in illuminator 6;
- 12: A voltage source, allowing the sample holder H, or at least the sample S, to be biased (floated) to an electrical potential with respect to ground, if desired;
- 14: A display, such as a FPD or CRT;
- 22*a*, 22*b*: A segmented electron detector 22*a*, comprising a plurality of independent detection segments (e.g. quadrants) disposed about a central aperture 22*b* (allowing passage of the beam B). Such a detector can, for example, be used to investigate (the angular dependence of) a flux of output (secondary or backscattered) electrons emerging from the sample S.

Here also, a controller 20 is present. The controller is connected to the display 14, and the display 14 can be connectable to a data processing apparatus P that is arranged for carrying out the method as defined herein. In the embodiment shown, the data processing apparatus P is a separate structure that does not form part of the controller, and does not even form part of the microscope P. The data processing apparatus P can be local or cloud based and is in principle not limited to any location.

The charged particle apparatuses shown in FIGS. 1 and 2, and Electron Microscope (EM) in particular, offer a number of ways to study samples.

The charged particle microscope can include an illuminator. The illuminator serves to manipulate a "raw" radiation beam from a charged particle source and perform upon it certain operations such as focusing, aberration mitigation, cropping (with an aperture), filtering, etc. It can comprise one or more electromagnetic lenses and can comprise other types of charged-particle optics components also. If desired, the illuminator can be provided with a deflector system that can be invoked to cause its exit beam to perform a scanning motion across the sample being investigated.

One or more detectors can be included for sample imaging and/or microanalysis. Detector(s) can assume many different forms, depending on the radiation being detected. Examples include photodiodes, CMOS detectors, CCD detectors, photovoltaic cells, X-ray detectors (such as Silicon Drift Detectors and Si(Li) detectors), etc. In general, a charged-particle microscope can comprise several different types of detector, selections of which can be invoked in different situations.

The charged particle microscope (in particular a (S)TEM) can also comprise an imaging system, which essentially takes charged particles that are transmitted through a sample (plane) and directs (focuses) them onto analysis apparatus, such as a detection/imaging device, spectroscopic apparatus (such as an electron energy loss spectroscopy (EELS) device), etc. As with the illuminator referred to above, the imaging system can also perform other functions, such as aberration mitigation, cropping, filtering, etc., and it will generally comprise one or more charged-particle lenses and/or other types of particle-optical components.

Note in this Figure, the laser is not depicted but it is envisaged to be positioned in a similar fashion as shown in FIG. 1.

Figure 3:
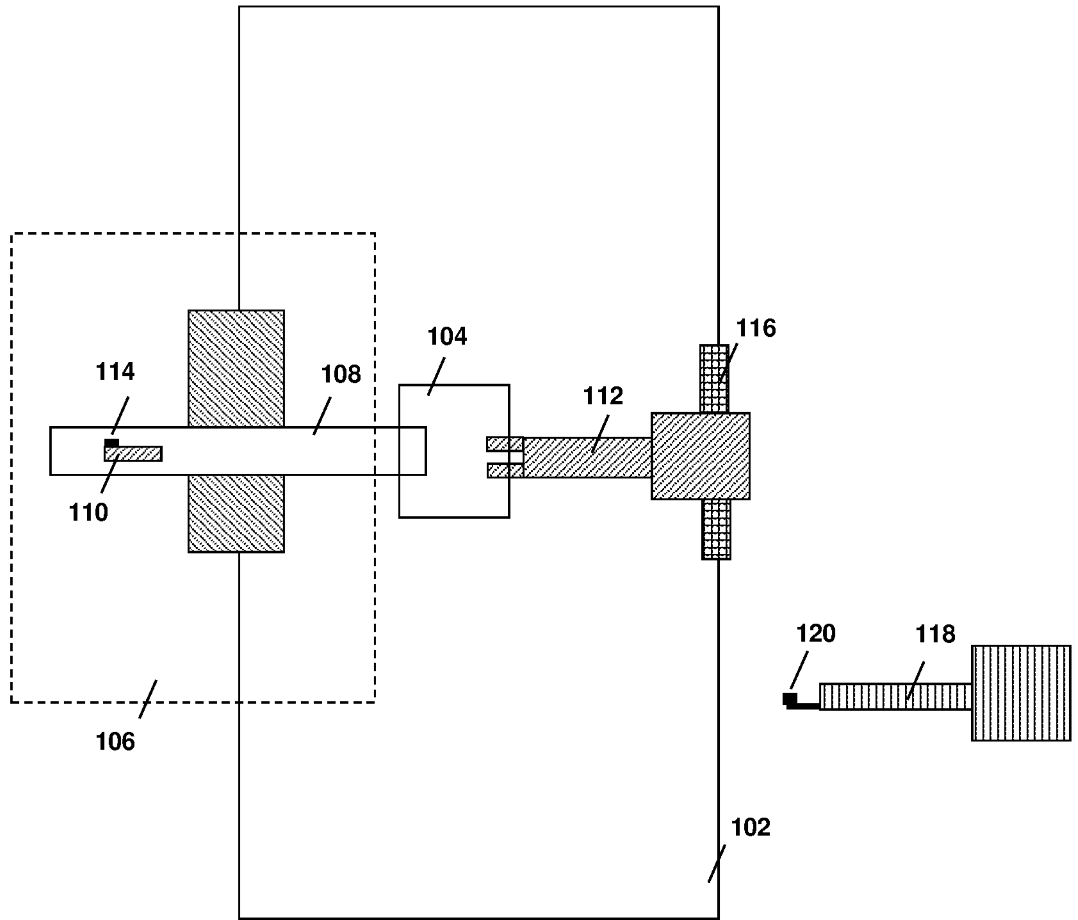
FIG. 3 shows a block diagram of a charged-particle optical system illustrating the position of the loader if present.

FIG. 3 is a block diagram of a charged-particle optical system 100 comprising a loader as can be used in the present disclosure. As charged-particle optical systems are shown in FIGS. 1 and 2, FIG. 3 only shows those components that are relevant to the present disclosure.

Charged-particle optical system 100, e.g., a TEM or a STEM, comprises a vacuum chamber 102, coupled to vacuum pump (not shown) and having a space 104 for accommodating a specific one of multiple cartridges in operational use of charged-particle optical system 100. System 100 also has a loader 106. Loader 106 accommodates a loading arm 108 that is moveable into and out of space 104. Loading arm 108 is configured for enabling to removably attach a cartridge 110, brought from outside charged-particle optical system 100, or from outside chamber 102, to a cartridge holder 112 or to detach the cartridge 110 from the cartridge holder 112 and remove the cartridge 110 from inside chamber 102, or from inside system 100. Cartridge 110 is configured for accommodating a sample 114 and/or at least one vaporization material/target. System 100 can be configured to bring in more than one cartridge to be placed on one or more cartridge holders and remove more than one cartridge from those cartridge holders.

The loader can typically be held within a loader chamber. The loader chamber is typically configured to provide variation in vacuum pressure depending on the location of the at least one cartridge. For example, the at least one cartridge can be introduced to the loader (within the loader chamber) under ambient pressure. The pressure within the chamber can then be adjusted such that it equals or is just above/below that in the vacuum chamber of the charged particle microscope (for example is at, or just above or just below ultra-high vacuum). The at least one cartridge can then be transferred from the loader chamber (via the loader) into the vacuum chamber of the charged particle microscope. The loader can then be returned to the loader chamber and the pressure in the loader chamber returned to ambient.

The loader chamber can also comprise a guiding means configured to guide a gripper when moving to attach or detach the cartridge or cartridge holder. In this way, the charged particle microscope can have means for mechanically engaging the vacuum load lock and the gripper so as to allow locking the gripper in a retracted position inside the system or chamber and outside the system or chamber. For example, the means can comprise a key and a guiding channel matching the key. The key is positioned on one of the gripper and the vacuum load lock, and the guiding channel is positioned in the other one of the gripper and the vacuum load lock.

To maintain the respective vacuum pressures during the loading procedure, the loader chamber typically comprises a vacuum load lock. As known, a vacuum load lock enables the loader to bring objects, such as cartridges or cartridge holders, into or out of the vacuum chamber of the charged particle microscope, while preserving the vacuum as described above.

As used herein, “substantially impacting” means that the conditions within the vacuum chamber, such as the pressure, change (i.e. increase or decrease) by less than about 10%, preferably less than about 5%, such as less than about 2% or 1%.

As used herein, “substantial loss of pressure” means that the pressure in the vacuum chamber of the charged particle microscope change (i.e. increase or decrease) by less than about 10%, preferably less than about 5%, such as less than about 2% or 1%.

Typically, the loader can be configured for enabling to attach the at least one cartridge, brought from outside the vacuum chamber of the charged-particle microscope, to a cartridge holder, such as a first cartridge holder within the vacuum chamber of the charged-particle microscope, or to detach the cartridge from the cartridge holder within the vacuum chamber of the charged-particle microscope, such as the first cartridge holder, and to remove the cartridge from inside the vacuum chamber of the charged-particle microscope.

If more than one cartridge is present, then the sample and/or target can be moved depending on the product to be obtained. For example, the target is in a separate cartridge to the sample, can be in a fixed position (for both deposition and irradiation) and the sample can be in a moveable position, allowing for the sample to be moved into close/closer proximity of the target when heating (ablating) and to the beam when irradiating. Alternatively, if the sample is in a separate cartridge to the target, both the sample and the target can be in a movable position, allowing for either the target or sample to be moved closer to the laser during heating (ablation) and the closer to the beam during irradiation.

This can be achieved by a second stage being provided within the vacuum chamber of the charged particle microscope.

The at least one cartridge can be held in the same position for deposition and irradiation. For example, where two cartridges are present one cartridge can be positioned on one (primary) stage and the second cartridge can be positioned on a further (secondary) stage with the second stage positioned such that any vaporisation material/targets within the cartridge can be evaporated to deposit material on the sample, where both stages are maintained in the same position for both deposition and irradiation.

Advantageously, maintaining the position of the sample for deposition and irradiation permits irradiation can be performed while deposition is taking place.

The at least one cartridge can be held in in at least one cartridge holder. The stage can form at least part of the cartridge holder or can be separate from the cartridge holder. Where the stage is separate from the cartridge holder, the vacuum chamber will comprise means to transfer the cartridge holder comprising the cartridge to the stage.

The stage can include at least part of the aforementioned cartridge holder (and an associated positioning system/set of actuators), but it can also be a dedicated transfer tool, e.g. an actuated manipulator as referred to above, or some other type of movable (robot) arm.

This can be advantageous as it can be desirable to control any disadvantageous effects that might be caused by unintended migration of evaporated material/target into the general vacuum environment of the charged-particle microscope. Using a means as described above is useful in that it can be used to deflect the evaporated material/target plume's cross-section upstream of a sample located at the deposition position, thereby blocking portions of that cross-section that wouldn't impinge on the sample anyway.

Figure 4:
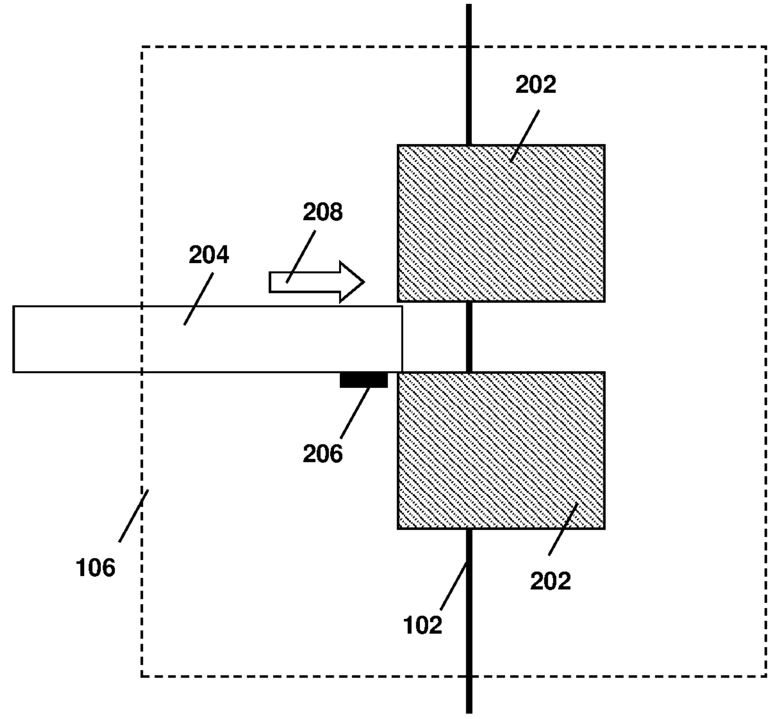
FIG. 4 a block diagrams further illustrating the loader.

FIG. 4 is a block diagram of loader 106 in the present disclosure, represented in cross-section. Loader 106 comprises a vacuum load lock 202. Part 208 comprises a gripper 204 that is keyed to vacuum load lock 202. Vacuum load lock 202 enables to use gripper 204 for loading cartridge 110 with sample 114 and/or at least one vaporization material/target into charged-particle optical system 100 in order to attach cartridge 110 to holder 112 or for removing cartridge 110 from holder 112 and from charged-particle optical system 100 as shown in FIG. 3.

Gripper 204 can be manually controlled, or using suitable actuators known from robotics, can be automatically controlled by a computer or microcontroller. Cartridge 110 and holder 112 are designed according to, e.g., the approach disclosed in US patent application publication 2008/0250881, or another suitable approach that enables to mechanically match cartridge 110 with holder 112 using gripper 204. Vacuum load lock 202 preserves the vacuum in space 104 during the loading and unloading of carrier 110.

The keying of vacuum load lock 202 and gripper 204 is such that gripper 204 can only be loaded into, or removed from, vacuum load lock 202 in a certain orientation relative to vacuum load lock 202. After attaching cartridge 110 to holder 112, gripper 204 is retracted into vacuum load lock 202 and can stay there for the duration of the experiment conducted on sample 114 and/or at least one vaporization material/target, being positioned so as to not interfere with the electron beam or with holder 112 when the latter has the orientation changed of its tip so as to tilt sample 114 and/or at least one vaporization material/target with respect to the direction of the electron beam.

Figure 5:
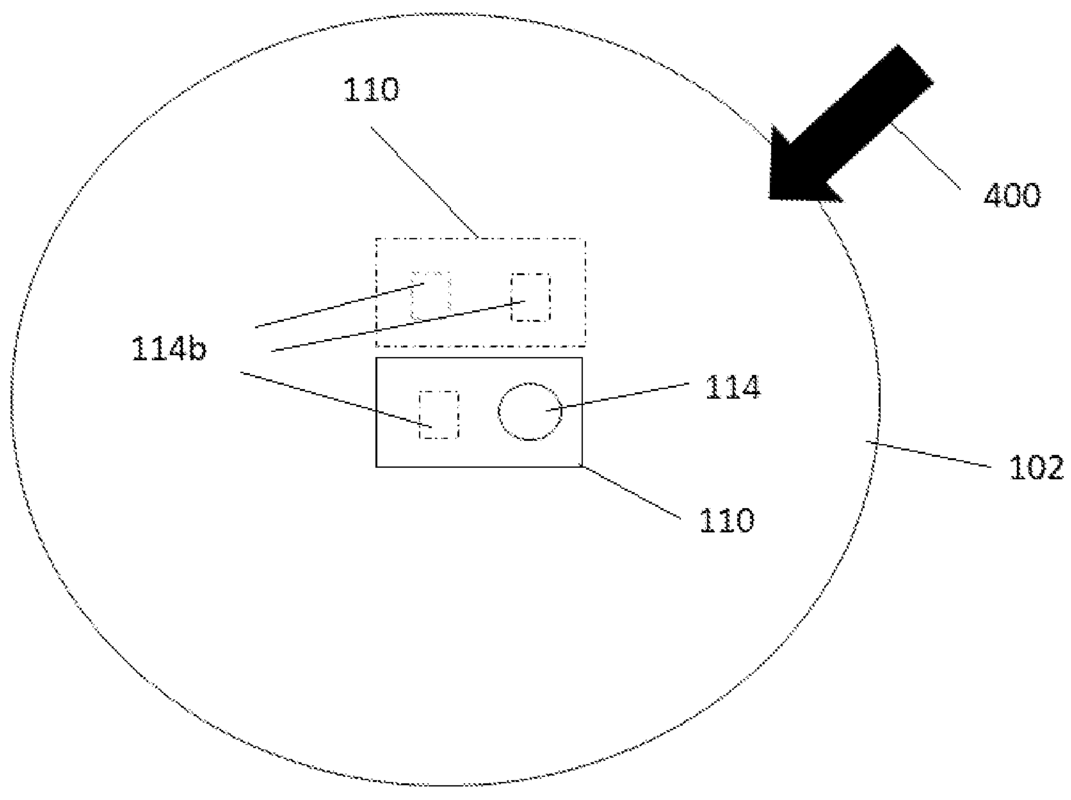
FIG. 5 a block diagram illustrating possible positioning of the at least one cartridge, sample, at least one vaporisation material/target and laser within the vacuum chamber of the charged particle microscope.

FIG. 5 is a block diagram illustrating the potential positioning of the at least one cartridge (110) within the vacuum chamber (102) of a charged particle microscope. As can be seen, there can be more than one cartridge (110) within the chamber, and each cartridge can comprise a sample (114) and/or at least one vaporization material/target (114*b*), so long as there is a sample and at least one target within the vacuum chamber to enable thermal laser epitaxy to be conducted on the material/target and sample. Typically, the at least one cartridge would be positioned in a cartridge holder on a stage within the charged particle microscope, but these have not been shown for simplicity reasons.

The vacuum chamber 102 of the charged particle microscope can be any chamber suitable for forming a vacuum in a charged particle microscope. It can be preferred that the vacuum chamber is a chamber that can provide a pressure of $10^{-3}$ mbar or lower, such as a pressure of from about $10^{-8}$ to about $10^{-10}$ mbar (i.e. an ultra-high vacuum). For example, in the charged particle microscope of the present disclosure the vacuum chamber can be set (in use) at a pressure of from about $10^{-8}$ to about $10^{-10}$ mbar (i.e. an ultra-high vacuum).

A laser (400) is shown in FIG. 5. However, it should be appreciated that the laser can be positioned at any point around the vacuum chamber to allow in-situ thermal laser epitaxy to be performed between the at least one target and sample in different instrument configurations (e.g., based at least in part on port selection).

The laser can be focused to a small enough spot on a target, e.g. 15 μm, and/or powerful enough to ablate material of the target, and can be configured to direct a focused beam onto the target (e.g., at a range of about 100 μm) or between multiple targets (e.g., about 500 to 1000 μm apart).

The particle-optical column can include a radiation source, such as a Schottky electron source, a cold electron source or ion gun. The particle-optical column is typically connected to the vacuum chamber such that the irradiating beam can reach a sample. For example, the particle optical column can be positioned at least partly within the vacuum chamber of the charged particle microscope as shown in FIG. 1.

The charged particle microscope can further comprise a means for directing the evaporated plume of material/target onto the sample. For example, by the use of lenses and/or mirrors in combination with a limiting aperture, disposed between the laser and deposition position, for limiting and/or controlling the evaporated plume of material/target onto the sample.

The mirror, if present in the cartridge, can be used to deflect the laser onto the at least one target. Typically, the mirror can be any highly reflective material. The mirror is typically positioned so that the laser beam is able to evaporate the at least one vaporisation material/target. For example, the mirror can be positioned so that the laser beam is able to evaporate one, two or three separate vaporisation material/targets.

In the charged particle microscope of the present disclosure, any laser suitable for thermal laser epitaxy as previously defined can be used. It is preferred if the laser has from 1 to 3 degrees of freedom in determining the laser focus relative to the XYZ planes, for example 2 degrees of freedom to provide suitable coverage of the vaporisation material/target within the vacuum chamber.

As detailed above, the vacuum chamber of the charged particle microscope of the present disclosure can be arranged to receive more than one vaporisation material/target within either a single or multiple (i.e. more than one) cartridge(s). Accordingly, the laser can heat multiple vaporisation material/targets to provide multiple evaporated material/target plumes. The multiple vaporisation material/targets can be heated concurrently (e.g., at the same time, in parallel, simultaneously, or the like), or they can be heated in sequence (e.g., consecutively, sequentially, or the like). Preferably, the multiple vaporisation material/targets are heated (and therefore deposited) in sequence, i.e. building layer by layer.

This is advantageous as multiple deposition layers can be provided on the sample that can subsequently be irradiated without having to break vacuum, thereby reducing contamination.

As detailed above, the at least one cartridge can be held in a deposition position for heating the at least one vaporisation material/target with the laser and an irradiation position for irradiation of the sample with the charged particle beam. Where multiple vaporisation materials/targets are present, it can be desirable for the at least one cartridge to move between the deposition position and the irradiation position multiple times. For example, to check deposition on the sample, before further depositions are performed.

In the charged particle microscope of the present disclosure, it is envisaged that the microscope can be single or dual beam. In the case of a dual-beam microscope, there can be two or more particle-optical columns, for producing two different species of charged particle. It is envisaged that any charged particle microscope could be used. However, it can be preferred that the charged particle microscope is a transmission electron microscope (TEM). Irradiating the sample with a charged particle beam can be used as part of imaging the sample surface and/or as part of sample microanalysis.

The cartridge holder can releasably hold the at least one cartridge, in which a sample and/or at least one vaporisation material/target can be received (or other carrier that has to be attached to a holder already in place in the system), within the vacuum chamber.

The cartridge holder can hold one or more cartridges so long as there is at least a sample and a vaporisation material/target within the vacuum chamber. For example, a cartridge can include both the sample and at least one vaporisation material/target, therefore the cartridge holder can hold one cartridge. Alternatively, the sample and at least one vaporisation material/target can be present in separate cartridges or it can be desired to include more than one vaporisation material/target in one or more cartridges, therefore the cartridge holder can hold more than one, such as two, three or four or more cartridges. Alternatively, more than one cartridge holder can be used to hold more than one cartridge.

The vaporisation material/target can comprise any material that is suitable for thermal laser epitaxy. In particular, the material or target is a material or target that can be applied through thermal laser epitaxy to provide/build products on a surface, for example metallic layered products and semiconductors.

As used herein, the terms "about" or "approximately" for any numerical values or ranges indicate a suitable dimensional tolerance that allows the part or collection of components to functions for its intended purpose as described.

The invention claimed is:

1. A charged particle microscope (CMP) comprising:

a vacuum chamber, a particle-optical column configured to produce a charged particle beam and to direct it so as to irradiate a sample in the vacuum chamber;

a cartridge holder for releasably holding at least one cartridge;

an illuminator for directing the charged particle beam emitted from the particle column onto the sample;

a detector for detecting a flux of radiation emanating from the sample in response to irradiation by said beam; and a laser;

wherein the charged particle microscope further comprises a control unit configured to control operations of the charged particle microscope;

wherein the sample and at least one vaporisation material/target are separately disposed in the at least one cartridge and the at least one cartridge is configured to allow movement of both the sample and the at least one vaporisation material/target in and out of the vacuum chamber and to permit in-situ heating of the at least one vaporisation material/target by the laser; and wherein the laser is configured to heat the at least one vaporisation material/target in-situ to produce an evaporated plume of material/target onto the sample.

2. The charged particle microscope of claim 1, wherein the microscope further comprises a loader comprising guiding means for controllably guiding the at least one cartridge into and out of the vacuum chamber.

3. The charged particle microscope of claim 1, wherein the at least one cartridge is held in a deposition position for heating the at least one vaporisation material/target with the laser and an irradiation position for irradiation of the sample with the charged particle beam.

4. The charged particle microscope of claim 3, wherein the microscope further comprises a stage configured to move the at least one cartridge between the deposition position and the irradiation position.

5. The charged particle microscope of claim 3, wherein the microscope further comprises a stage configured to maintain the geometry of the cartridge such that the irradiation position and the deposition position coincide.

6. The charged particle microscope of claim 1, wherein the sample is in the same cartridge as at least one vaporisation material/target.

7. The charged particle microscope of claim 1, wherein the sample is in a separate cartridge to the at least one vaporisation material/target.

8. The charged particle microscope of claim 1, wherein the vacuum chamber is configured to exchange at least one cartridge without substantially impacting conditions within the vacuum chamber.

9. The charged particle microscope of claim 1, wherein at least one of the at least one cartridge comprises a mirror to deflect evaporated material/target to the sample or a specific region of the sample.

10. The charged particle microscope of claim 1, wherein the laser has from 1 to 3 degrees of freedom.

11. The charged particle microscope of claim 1, wherein the laser is further configured to heat multiple vaporisation material/targets concurrently or sequentially.

12. The charged particle microscope of claim 1, wherein the charged-particle microscope is a transmission electron microscope (TEM).

13. The charged particle microscope of claim 1, wherein the vacuum chamber is configured to maintain a pressure of $10^{-3}$ mbar or lower.

14. A method of performing in-situ thermal laser epitaxy and sample analysis in a charged-particle microscope, the method comprising:

providing a sample and at least one vaporisation material/target, separate and distinct from the sample, in at least one cartridge;

loading the at least one cartridge into the vacuum chamber; and heating the at least one target with the laser, in situ, to provide a vapour plume of target material from the target toward the sample.

15. The method of claim 14, further comprising the step of irradiating the sample with a charged particle beam.

16. The method of claim 14, wherein the cartridge is held in a cartridge holder within the vacuum chamber of the charged-particle microscope.

17. The method of claim 14, wherein the cartridge and/or cartridge holder is placed on a stage within the vacuum chamber of the charged-particle microscope.

18. The method of claim 17, wherein the stage moves the cartridge between the deposition position and the irradiation position.

19. The method of claim 17, wherein the stage maintains the geometry of the cartridge such that the irradiation position and the deposition coincide.

20. A cartridge, configured to receive a sample and at least one vaporisation material/target, separate and distinct from the sample, and configured to be releasably held in a cartridge holder, the cartridge holder being configured for disposing in a vacuum chamber of a charged particle microscope, wherein the cartridge is configured to allow movement of the sample and at least one vaporisation material/target in and out of the vacuum chamber, and to permit in-situ heating of the at least one vaporisation material/target by the laser, and wherein the cartridge holder orients the cartridge toward a laser, the laser being configured to heat the at least one vaporisation material/target in-situ to produce an evaporated stream of material/target onto the sample.

* * * * *